United States Patent [19]
Olsson et al.

[11] Patent Number: 5,912,051
[45] Date of Patent: Jun. 15, 1999

[54] COATED CUTTING INSERT

[75] Inventors: Björn Olsson, Huddinge; Björn Ljungberg, Enskede, both of Sweden

[73] Assignee: Sandvik AB, Sandviken, Sweden

[21] Appl. No.: 09/034,230

[22] Filed: Mar. 4, 1998

Related U.S. Application Data

[62] Division of application No. 08/616,012, Mar. 14, 1996.

[30] Foreign Application Priority Data

Apr. 5, 1995 [SE] Sweden ................................. 9501286

[51] Int. Cl.⁶ ................................................... C20C 16/00
[52] U.S. Cl. ..................................... 427/255.1; 427/248.1; 427/255.2; 427/255.3; 427/255.7
[58] Field of Search ............................. 427/255.1, 248.1, 427/255.2, 255.3, 255.7

[56] References Cited

U.S. PATENT DOCUMENTS

| | | |
|---|---|---|
| 4,180,400 | 12/1979 | Smith et al. . |
| 4,610,931 | 9/1986 | Nemeth et al. . |
| 4,619,866 | 10/1986 | Smith et al. . |
| 5,071,696 | 12/1991 | Catfield et al. . |
| 5,137,774 | 8/1992 | Ruppi . |
| 5,162,147 | 11/1992 | Ruppi . |
| 5,374,471 | 12/1994 | Yoshimura et al. . |
| 5,487,625 | 1/1996 | Ljungberg et al. . |
| 5,543,176 | 8/1996 | Catfield et al. . |
| 5,545,490 | 8/1996 | Oshika . |
| 5,635,247 | 6/1997 | Ruppi . |
| 5,652,045 | 7/1997 | Nakamura et al. . |

FOREIGN PATENT DOCUMENTS

| | | |
|---|---|---|
| 440157 | 8/1991 | European Pat. Off. . |
| 594875 | 5/1994 | European Pat. Off. . |
| 0653499 A1 | 5/1995 | European Pat. Off. . |
| 0685572 A2 | 12/1995 | European Pat. Off. . |
| 709484 | 5/1996 | European Pat. Off. . |
| 0736615 A2 | 10/1996 | European Pat. Off. . |
| 6-008008 | 1/1994 | Japan . |
| 459100 | 6/1989 | Sweden . |
| 502174 | 9/1995 | Sweden . |
| 502223 | 9/1995 | Sweden . |
| 1332878 | 3/1972 | United Kingdom . |

*Primary Examiner*—Archene Turner
*Attorney, Agent, or Firm*—Burns, Doane, Swecker & Mathis, L.L.P.

[57] ABSTRACT

The present invention discloses a coated cutting insert particularly useful for dry milling of grey cast iron. The insert is characterized by a WC—Co cemented carbide substrate and a coating including an innermost layer of $TiC_xN_yO_z$ with columnar grains and a top coating of a fine gained $\alpha\text{-}Al_2O_3$ layer.

3 Claims, 1 Drawing Sheet

COATED CUTTING INSERT

This application is a divisional of application Ser. No. 08/616,012, filed Mar. 14, 1996 now allowed.

BACKGROUND OF THE INVENTION

The present invention relates to a coated cemented carbide insert cutting tool particularly useful for dry milling of grey cast iron.

Grey cast-iron is a material which, in general, is reasonably easy to machine with cemented carbide tools. Often, long tool life can be obtained. However, the machinability of cast iron can vary considerably. The tool life may be influenced significantly by small variations in the chemical composition within the material. These variations may be related to the casting technique used, such as the cooling conditions. Other causes for variations are the casting skin and sand inclusions, if present, or even the stability of the machine used for cutting the material. It is well-known that the machinability of a cast iron may vary from one batch to another.

There is always a desire for a reliable and stable tool life in mass volume production and in particular when unmanned production is employed.

When machining grey cast iron using coated milling cutters, the cutters are worn mainly by a so called adhesive wear mechanism. That is, fragments or individual grains of the layers and later also parts of the cemented carbide are successively pulled away from the cutting edge by the chip formed. Such wear mechanism is further accelerated by the formation of cracks about 50 µm apart along and perpendicular to the cutting edge generally referred to as comb cracks. They are the result of thermal fatigue caused by the intermittent cutting which is typical for all milling cutting operations. Commercial cemented carbide milling inserts therefore generally contain gamma-phase, which is a solid solution of WC—TiC—TaC—NbC, in order to decrease heat influenced wear mechanism.

As soon as the coating is worn out, the underlying cemented carbide will wear fast. This will lead to higher cutting forces. The comb cracks formed will, after some time, cause severe chipping of the cutting edge and the damaged tool will generate a bad surface or chipping of the machined component.

Chipforming operations predominantly of adhesive wear type put high demands on both the coating and the cemented carbide. A cemented carbide that can withstand comb crack formation as long as possible and a coating that adheres well to the cemented carbide is desirable. Further, it is desired that there are low adhesion forces between the chip and the coating and that the coating has a high internal strength (cohesiveness) a property which is believed to be of significant importance.

OBJECTS AND SUMMARY OF THE INVENTION

It is an object of this invention to avoid or alleviate the problems of the prior art.

It is further an object of this invention to provide a coated cemented carbide insert cutting tool useful for dry milling of grey cast iron.

In one aspect of the invention there is provided a cutting insert for milling of grey cast iron comprising a substrate and a coating, said substrate comprising WC, 3–15 weight-% Co and $\leq 2$ weight-% carbides of metals from groups IVb, Vb or VIb of the periodic table and said coating comprising:

a first (innermost) layer of $TiC_xN_yO_z$ with a thickness of 0.1–2 µm, and with equiaxed grains with size <0.5 µm;

a layer of $TiC_xN_yO_z$ with a thickness of 2–10 µm with columnar grains with a diameter of about <5 µm;

a layer of $TiC_xN_yO_z$ with a thickness of 0.1–2 µm and with equiaxed or needlelike grains with size $\leq 0.5$ µm; and an outer layer of smooth, textured, fine-grained $\alpha$-$Al_2O_3$ layer with a thickness of 2–10 µm.

In another aspect of the invention there is provided a method of making a cutting insert comprising a substrate and a coating comprising coating a WC—Co-based substrate with:

a first (innermost) layer of $TiC_xN_yO_z$ with a thickness of 0.1–2 µm, with equiaxed grains with size <0.5 µm by CVD;

a layer of $TiC_xN_yO_z$ with a thickness of 2–10 µm with columnar grains and with a diameter of about <5 µm deposited.;

a layer of $TiC_xN_yO_z$ with a thickness of 0.1–2 µm with equiaxed or needlelike grains with size $\leq 0.5$ µm, by CVD; and an outer layer of a smooth textured $\alpha$-$Al_2O_3$ layer with a thickness of 2–10 µm by CVD.

DETAILED DESCRIPTION OF THE PREFERRED EMBODIMENTS OF THE INVENTION

Figure 1:
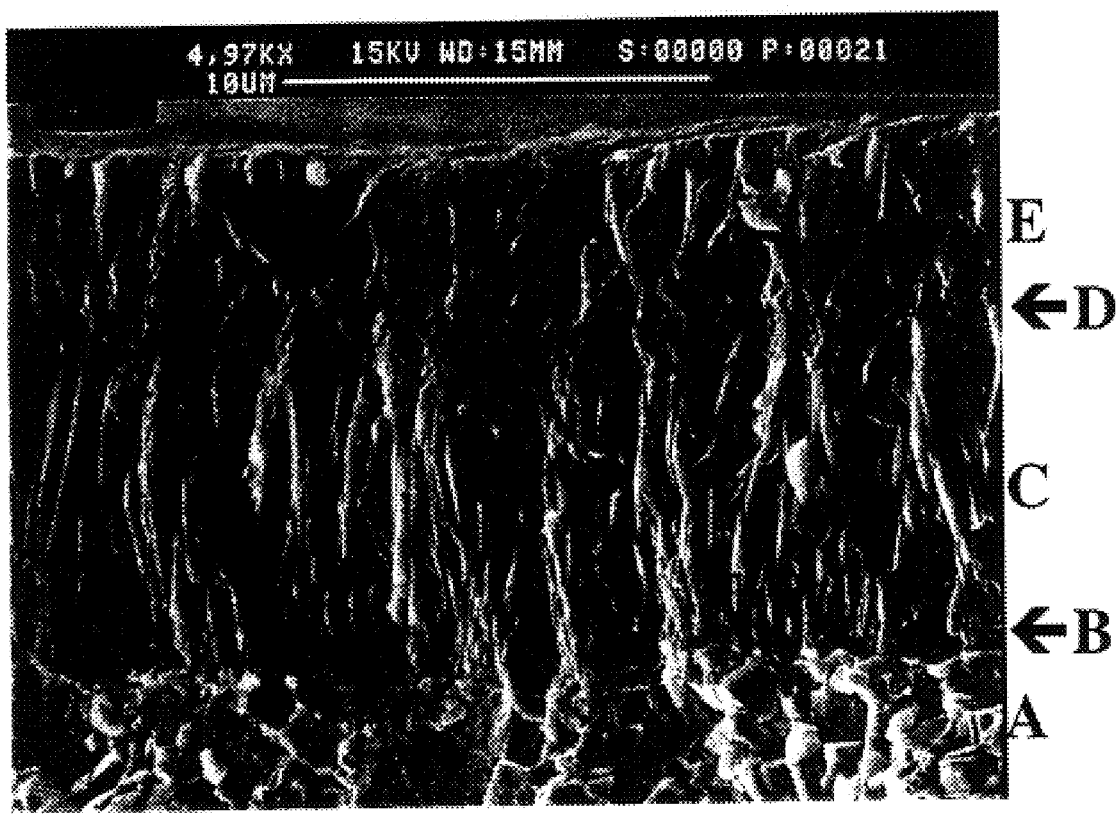
FIG. 1 is a micrograph in 5000× magnification of a coated insert according to the present invention in which A—substrate B—$TiC_xN_yO_z$-layer with equaled grains C—$TiC_xN_yO_z$-layer with columnar grains D—$TiC_xN_yO_z$-layer with equiaxed or needlelike grains E—(012)-textured $\alpha$-$Al_2O_3$-layer with columnar like grains

It has surprisingly been found that a straight WC—Co cemented carbide body herein referred to as the substrate essentially provided with a first/inner columnar grained coating structure consisting of mainly a $TiC_xN_yO_z$-layer with columnar grains and a columnar like textured fine-grained $\alpha$-$Al_2O_3$ layer on top performs very well particularly in cast iron milling. In fact such a tool has been found to have a cutting performance far better than prior art tools.

According to the present invention a cutting tool insert is provided of a coated cemented carbide substrate of a WC+Co composition containing 3–15, preferably 5–12, most preferably 5–8 wt-% Co, and with a WC grain size of 1–2 µm, preferably about 1.5 µm. In addition, the substrate may contain up to 2 wt-% cubic carbides of metals from groups IVb, Vb or VIb of the periodic table such as TiC, TaC and NbC. However, a straight WC+Co composition is preferred.

The coating comprises a first (innermost) layer of $TiC_xN_yO_z$ with x+y+z=1, preferably z<0.5, with a thickness of 0.1–2 µm, and with equiaxed grains with size <0.5 µm a next layer of $TiC_xN_yO_z$ x+y+z=1, preferably with z=0 and x>0.3 and y>0.3, with a thickness of 2–10 µm, preferably 4–7 µm, with columnar grains and with a diameter of about <5 µm, preferably <2 µm, a next layer of $TiC_xN_yO_z$, x+y+z=1 with $z \leq 0.5$, preferably z>0.1, with a thickness of 0.1–2 µm and with equiaxed or needlelike grains with size $\leq 0.5$ μm, this layer being the same as or different from the innermost layer, and an outer layer of a smooth, textured, fine-grained (grain size about 1 μm) α-Al$_2$O$_3$ layer with a thickness of 2–10 μm, preferably 3–6 μm, and a surface roughness (R$_a$) of less than 0.3 mm over a measured length of 0.25 mm. Preferably, this Al$_2$O$_3$-layer is the outermost layer but it may also be followed by further layers such as a thin (about 0.1–1 μm) decorative layer of, e.g., TiN as is known in the art.

In addition, the α-Al$_2$O$_3$ layer has a preferred crystal growth orientation in either the (012)-, (104)- or (110)- direction, preferably in the (012)- direction, as determined by X-ray Diffraction (XRD) measurements. A Texture Coefficient, TC, is defined as:

$$TC(hkl) = \frac{I(hkl)}{I_o(hkl)} \left\{ \frac{1}{n} \sum \frac{I(hkl)}{I_o(hkl)} \right\}^{-1}$$

where

I(hkl)=measured intensity of the (hkl) reflection

I$_o$(hkl)=standard intensity of the ASTM standard powder pattern diffraction data n=number of reflections used in the calculation, (hkl) reflections used are: (012), (104), (110), (113), (024), (116)

According to the invention, TC for the set of (012), (104) or (110) crystal planes is larger than 1.3, preferably larger than 1.5.

According to method of the invention, a WC—Co-based substrate is coated with a first (innermost) layer of TiC$_x$N$_y$O$_z$ with x+y+z=1, preferably z<0.5, with a thickness of 0.1–2 μm, and with equiaxed grains with size <0.5 μm using known CVD methods, a next layer of TiC$_x$N$_y$O$_z$ x+y+z=1, preferably with z=0 and x>0.3 and y>0.3, with a thickness of 2–10 μm, preferably 4–7 μm, with columnar grains and with a diameter of about <5 μm, preferably <2 μm, deposited either by MTCVD-technique (using acetonitrile as the carbon and nitrogen source for forming the layer in the temperature range of 700–900° C.) or by high temperature CVD-technique (1000–1100° C.), the process conditions being selected to grow layers with columnar grains, that is generally high pressure (0.3–1 bar). However, the exact conditions depend to a certain extent on the design of the equipment used, a next layer of TiC$_x$N$_y$O$_z$ x+y+z=1 with z$\leq$0.5, preferably z>0.1, with a thickness of 0.1–2 μm and with equiaxed or needlelike grains with size $\leq$0.5 μm, using known CVD-methods this layer being the same as or different from the innermost layer, and an outer layer of a smooth textured α-Al$_2$O$_3$ layer with a thickness of 2–10 μm, preferably 3–6 μm, and a surface roughness (R$_a$) of less than 0.3 μm over a measured length of 0.25 mm according to Swedish patent 501 527 or U.S. patent application Ser. Nos. 08/348,084 (our reference: 024444-092) and 08/366,107 (our reference: 024444-093).

When a TiC$_x$N$_y$O$_z$-layer with z>0 is desired, CO$_2$ and/or CO is added to the reaction gas mixture.

The invention is additionally illustrated in connection with the following Examples which are to be considered as illustrative of the present invention. It should be understood, however, that the invention is not limited to the specific details of the Examples.

EXAMPLE 1

A) Cemented carbide milling inserts of style TNEF 1204AN-65 and of style SEKN1204AZ with the composition 6% Co and balance WC were coated with a 0.5 μm equiaxed TiCN-layer followed by a 5 μm thick TiCN layer with columnar grains by using MTCVD-technique (process temperature 850° C.). In subsequent process steps during the same coating cycle, a 1 μm thick layer with equiaxed grains of TiC$_x$N$_y$O$_z$ (approx. x=0.6, y=0.2 and z=0.2) was deposited followed by a 4 μm thick layer of (012)-textured α-Al$_2$O$_3$ deposited according to conditions given in Swedish patent 501 527. XRD-measurement showed a texture coefficient TC(012) of 1.5. After coating, the inserts were smoothed by wet blasting.

B) Cemented carbide milling inserts of style TNEF 1204AN-65 were coated with a 1 μm layer with equiaxed grains of TiCN followed by 5 μm thick layer of columnar grains of a TiCN by high temperature CVD-technique (1020° C., process pressure 400 mbar). In subsequent process steps during the same coating cycle, a 1 μm thick layer with equiaxed grains of TiC$_x$N$_y$O$_z$ (approx. x=0.6, y=0.2 and z=0.2) was deposited followed by a 4 μm thick layer of (012)-textured αAl$_2$O$_3$ deposited according to conditions given in Swedish patent 501 527. XRD-measurement showed a texture coefficient TC(012) of 1.6. After coating, the inserts were smoothed by wet blasting.

C) Cemented carbide milling cutting inserts of style TNEF 1204AN-65 with the composition 5.5% Co and 8.5% cubic carbides and balance WC were coated under the procedure given in A). After coating, the inserts were smoothed by wet blasting.

D) Milling inserts from the same cemented carbide batch as in C) were coated with equiaxed 5 μm TiCN-coating and 4 μm Al$_2$O$_3$ carried out according to prior art technique resulting in a mixture of coarse α- and fine K—Al$_2$O$_3$ grains in the layer. The inserts were smoothed by wet blasting.

EXAMPLE 2

Inserts from A) were tested against two competitor grades as below:

Operation: Face milling with SANDVIK AUTO cutter, diameter 250 mm

Workpiece: Specially designed component.

Material: SS0125 (grey cast iron HB=205)

Cutting Speed: 129 m/min

Feed Rate: 0.24 mm/tooth

Depth of Cut: 2.0 mm

Insert-type: TNEF1204AN-65

Note: The operation was run without coolant (dry).

| RESULTS | TOOL-LIFE, MIN |
| --- | --- |
| GRADE A (ACCORDING TO INVENTION) | 40 |
| COMPETITOR 1 (PRIOR ART) | 20 |
| COMPETITOR 2 (PRIOR ART) | 25 |

Tool-life criterion was chipping on the exit side of the workpiece.

EXAMPLE 3

Inserts from A) were tested in another milling operation against two other competitors grades as below:

Operation: Face milling with SANDVIK 145-cutter, dia: 63 mm

Workpiece: hydraulic engine component

Material: SS0125 (grey cast iron HB=220)

Cutting Speed: 178 m/min
Feed Rate: 0.17 mm/tooth
Depth of Cut: 2–3 mm
Insert-type: SEKN1204AZ
Note: The operation was run without coolant (dry).

| RESULTS | TOOL-LIFE, HOURS |
|---|---|
| GRADE A (INVENTION) | 24 |
| COMPETITOR 3 (PRIOR ART) | 15 |
| COMPETITOR 4 (PRIOR ART) | 16 |

Tool-life criterion was surface finish.

EXAMPLE 4

Inserts from A), C) and D) were tested against each other in a milling operation.

Operation: Face milling with SANDVIK AUTO cutter, diameter 250 mm.
Workpiece: engine block
Material: SS0125 (GG26Cr) grey cast iron
Cutting Speed: 120 m/min
Feed Rate: 0.28 mm/tooth
Depth of Cut: 4–5 mm
Insert type: TNEF 1204AN-65
Note: The operation was run without coolant (dry).

The inserts were all run 868 passes and compared with respect to edge chipping.

| RESULTS | |
|---|---|
| VARIANT | DEGREE OF EDGE CHIPPING |
| A (INVENTION) | NONE |
| C (ONLY IMPROVED COATING) | MINOR |
| D (PRIOR ART) | SEVERE |

The results show the benefit of the coating according to the invention as well as combining this with the WC/Co-carbide substrate in order to achieve maximum performance.

EXAMPLE 5

Inserts from A), B) and D) were tested against each other in a milling operation.

Operation: Face milling with SANDVIK AUTO cutter, diameter 250 mm.
Workpiece: special designed test component
Material: SS0125 grey cast iron, HB=205
Cutting speed: 129 m/min
Feed rate: 0.30 mm/tooth
Depth of cut: 2 mm
Insert-type: TNEF 1204AN-65
Note: The operation was run without coolant (dry).

The inserts were all run 48 passes and compared with respect to edge chipping.

| RESULTS | |
|---|---|
| VARIANT | RELATIVE WIDTH OF CHIPPED AREA |
| A (INVENTION) | 0.3 |
| B (INVENTION) | 0.4 |
| D (PRIOR ART) | 1.0 |

The results show in practice equal performance of A) and B). The only difference is the coating temperature used when depositing the TiCN-layers. The prior art inserts show highest wear.

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. A method of making a cutting insert comprising a substrate and a coating comprising coating a WC—Co-based substrate with:

a first (innermost) layer of $TiC_xN_yO_z$ with a thickness of 0.1–2 $\mu$m, with equiaxed grains with size <0.5 $\mu$m by CVD;

a layer of $TiC_xN_yO_z$ with a thickness of 2–10 $\mu$m with columnar grains and with a diameter of about <5 $\mu$m;

a layer of $TiC_xN_yO_z$ with a thickness of 0.1–2 $\mu$m with equiaxed or needlelike grains with size $\leq$0.5 $\mu$m, by CVD; and an outer layer of a smooth textured $\alpha$-$Al_2O_3$ layer with a thickness of 2–10 $\mu$m by CVD.

2. The method of claim 1 wherein the said layer of $TiC_xN_yO_z$ with a thickness of 2–10 $\mu$m with columnar grains is deposited by MTCVD-technique using acetonitrile as the carbon and nitrogen source for forming the layer in the temperature range of 700–900° C.

3. The method of claim 1 wherein the said layer of $TiC_xN_yO_z$ is deposited by high temperature CVD-technique.

* * * * *